(12) United States Patent
Bengoechea De La Llera

(10) Patent No.: US 10,948,523 B2
(45) Date of Patent: Mar. 16, 2021

(54) METHODS AND APPARATUS FOR MEASURING A CURRENT

(71) Applicant: Lumiker Aplicaciones Tecnológicas S.L., Derio (ES)

(72) Inventor: Francisco Javier Bengoechea De La Llera, Loiu (ES)

(73) Assignee: LUMIKER APLICACIONES TECNOLÓGICAS S.L., Derio (ES)

( * ) Notice: Subject to any disclaimer, the term of this patent is extended or adjusted under 35 U.S.C. 154(b) by 115 days.

(21) Appl. No.: 16/516,427

(22) Filed: Jul. 19, 2019

(65) Prior Publication Data
US 2020/0025805 A1 Jan. 23, 2020

(30) Foreign Application Priority Data

Jul. 19, 2018 (EP) .................................... 18382544
Sep. 25, 2018 (EP) .................................... 18196585

(51) Int. Cl.
*G01R 15/22* (2006.01)
*G01R 15/24* (2006.01)
*G01R 19/00* (2006.01)

(52) U.S. Cl.
CPC ........... *G01R 15/22* (2013.01); *G01R 15/246* (2013.01); *G01R 15/247* (2013.01); *G01R 19/0092* (2013.01)

(58) Field of Classification Search
CPC ........ G01R 15/00; G01R 15/14; G01R 15/22; G01R 15/24; G01R 15/245; G01R 15/246;
(Continued)

(56) References Cited

U.S. PATENT DOCUMENTS 4,698,497 A   10/1987 Miller et al.
5,243,293 A *  9/1993 Isozaki ............... G01R 15/246
                                                      324/522
(Continued)

FOREIGN PATENT DOCUMENTS

EP    0729033 A2    8/1996
RU    2438138 C1   12/2011
(Continued)

OTHER PUBLICATIONS

Zhang et al., The effect of linear birefringence on fiber optic current sensor based on Faraday mirror, Visual commmunications and image processing, Proc. of SPIE, Jan. 20, 2004, vol. 9274, pp. 92741N-1-92741-N-8.
(Continued)

*Primary Examiner* — Hoai-An D. Nguyen
(74) *Attorney, Agent, or Firm* — Edell, Shapiro & Finnan, LLC

(57) ABSTRACT

A method for measuring the current circulating through at least one conductor with the use of optical fiber-based measuring equipment is provided. According to one implementation the measuring equipment includes a first emitter that emits a first signal which reaches a sensing branch through a first branch, runs through the sensing branch, and is modified depending on the current circulating through the conductor. A modified first signal is received by a second receiver from a second branch. A second emitter emits a second signal which reaches the sensing branch through the second branch, runs through the sensing branch, and is modified depending on the current circulating through the conductor. A modified second signal is received by a first receiver from the first branch. The current circulating through the conductor is determined by combining the modified first signal and the modified second signal.

23 Claims, 2 Drawing Sheets

(58) Field of Classification Search
CPC .. G01R 15/247; G01R 19/00; G01R 19/0084;
G01R 19/0092
USPC ....... 324/76.11, 96, 97, 522, 713; 702/1, 57,
702/64
See application file for complete search history.

(56) References Cited

U.S. PATENT DOCUMENTS

| | | |
|---|---|---|
| 6,495,999 B1 | 12/2002 | Beierl et al. |
| 6,515,467 B1 | 2/2003 | Bosselmann et al. |
| 7,046,867 B2* | 5/2006 | Bohnert ............... G01R 15/247 385/12 |
| 2009/0190921 A1* | 7/2009 | Nakajima .......... G01M 11/3136 398/13 |
| 2012/0283969 A1* | 11/2012 | Bohnert ................ G01R 35/00 702/64 |
| 2018/0095113 A1* | 4/2018 | Bengoechea De La Llera .......... G01R 15/246 |
| 2018/0131436 A1* | 5/2018 | Son ........................ H04B 10/27 |
| 2019/0064210 A1* | 2/2019 | Kawada ................ G01Q 60/16 |
| 2020/0271863 A1* | 8/2020 | Rose .................... G02B 6/2786 |

FOREIGN PATENT DOCUMENTS

| | | |
|---|---|---|
| WO | 2015124677 A1 | 8/2015 |
| WO | 2016198575 A1 | 12/2016 |

OTHER PUBLICATIONS

Extended European Search Report in corresponding Application No. EP18196585.6, dated May 14, 2019, 11 pages.

\* cited by examiner

METHODS AND APPARATUS FOR MEASURING A CURRENT

CROSS-REFERENCE TO RELATED APPLICATIONS

This application relates to and claims the benefit and priority to each of European Application Nos. EP18382544.7, filed Jul. 19, 2018 and EP18196585.6, filed Sep. 25, 2018.

TECHNICAL FIELD

The present invention relates to methods for measuring a current circulating through at least one conductor with an optical fiber-based measuring equipment, and to an optical fiber-based current measuring equipment for measuring the current circulating through at least one conductor.

BACKGROUND

Optical fiber-based sensors for measuring the current circulating through a conductor are known. The sensors work according to the Faraday effect, i.e., the magnetic field generated by the current circulating through the conductor causes rotation in the polarization of light circulating through the optical fiber arranged around the conductor. The operation of an optical fiber-based measuring equipment consists of emitting light through an optical fiber to a sensing portion in which the characteristics of the light are modified depending on the current circulating through the conductor, and analyzing the rotation caused in the polarization of light to determine the magnitude of the current going through the conductor.

WO2016198575A1, belonging to the same applicant of the present application is incorporated herein by reference in its entirety. WO2016198575A1 discloses an optical fiber-based current measuring equipment and an associated method. The current measuring equipment comprises an interrogator with an emitter and a receiver, and a sensing portion close to the conductor. The interrogator and the sensing portion are suitable for being connected through a standard single-mode intermediate fiber. This patent document describes several ways of implementing both the interrogator and the sensing portion. In one of the embodiments, the sensing portion comprises a first branch comprising a first polarizer and a rotator after said first polarizer, a second branch comprising a second polarizer, and a sensing branch comprising a sensing section arranged close to the conductor and a mirror. The first branch and the second branch are coupled to the sensing branch by means of a splitter.

In the method described for this embodiment, the pulses emitted by the emitter are received in the sensing branch through the first branch, whereas the pulses modified depending on the current circulating through the conductor are received by the receiver from the second branch.

SUMMARY

A first aspect relates to a method for measuring the current circulating through at least one conductor with an optical fiber-based measuring equipment.

The measuring equipment used for carrying out the method includes an interrogator comprising a first emitter, a second emitter, a first receiver, and a second receiver. The measuring equipment also comprises a sensing portion connected to the interrogator and arranged close to the conductor.

The sensing portion comprises a first branch comprising a first polarizer and a rotator after said first polarizer, a second branch comprising a second polarizer, and at least one sensing branch comprising a sensing section arranged close to the conductor and a mirror. The first branch and the second branch are coupled to the sensing branch by means of a splitter.

The first emitter emits a first signal which reaches the sensing branch through the first branch, runs through the sensing branch, and is modified depending on the current circulating through the conductor, and is received by the second receiver from the second branch.

Furthermore, the second emitter emits a second signal which reaches the sensing branch through the second branch, runs through the sensing branch, and is modified depending on the current circulating through the conductor, and is received by the first receiver from the first branch.

The current circulating through the conductor is thereby determined by combining the first modified signal and the second modified signal.

Combining the first modified signal and the second modified signal for calculating the current circulating through a conductor makes it easier to manufacture the measuring equipment as it allows suitably determining the current circulating through said conductor even though the calibration of the measuring equipment is not accurate.

A second aspect of the invention relates to an optical fiber-based current measuring equipment for measuring the current circulating through at least one conductor.

Said measuring equipment comprises an interrogator with a first emitter, a second emitter, a first receiver, and a second receiver. The measuring equipment also comprises a sensing portion connected to the interrogator.

The sensing portion comprises a first branch comprising a first polarizer and a rotator after said first polarizer, a second branch comprising a second polarizer, and a sensing branch comprising a sensing section arranged close to a conductor and a mirror, said first sensing branch being coupled to the first branch and the second branch by means of a splitter. The sensing portion also comprises at least one additional sensing branch comprising an additional sensing section configured for being arranged close to the conductor or to an additional conductor, a delayer, and an additional mirror. Said at least one additional sensing branch is coupled to the first branch and to the second branch by means of the splitter.

These and other advantages and features will become evident in view of the drawings and detailed description.

DETAILED DESCRIPTION

Figure 1:
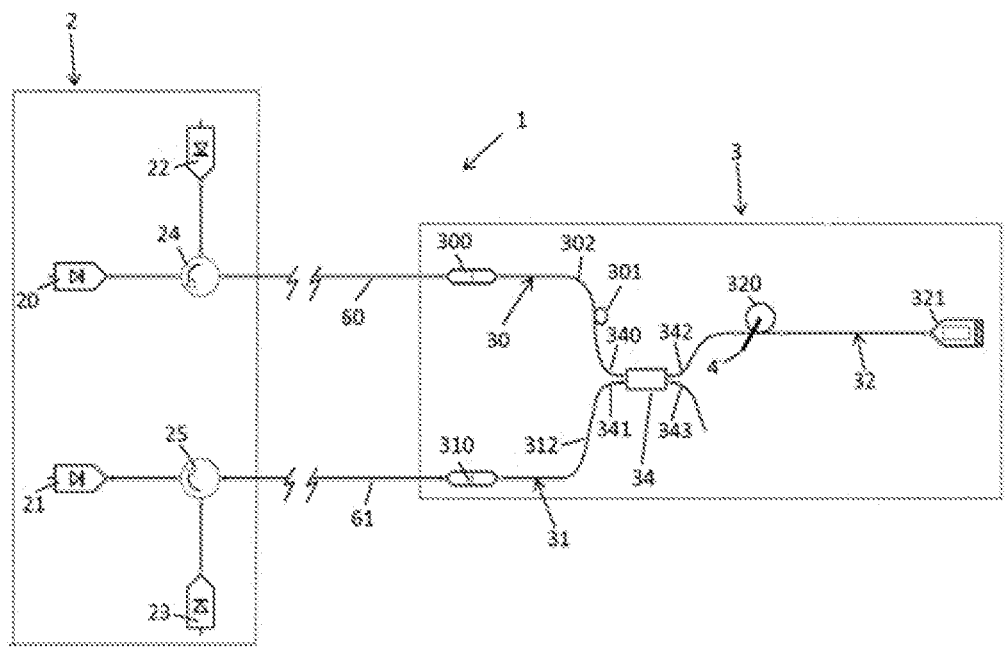
FIG. 1 schematically shows optical fiber-based current measuring equipment according to a first embodiment.

FIG. 1 shows a first embodiment of the optical fiber-based current measuring equipment 1 for measuring the current circulating through a conductor 4.

The measuring equipment 1 comprises an interrogator 2 comprising a first emitter 20 and a second emitter 21. The interrogator 2 also comprises a first receiver 22 and a second receiver 23.

Furthermore, the measuring equipment 1 comprises a sensing portion 3 connected to the interrogator 2 and arranged close to the conductor 4. The sensing portion 3 comprises a first branch 30 comprising a first polarizer 300 and a rotator 301 after said first polarizer 300, and a second branch 31 comprising a second polarizer 310. The sensing portion 3 also comprises at least one sensing branch 32 comprising a sensing section 320 arranged close to the conductor 4 and a mirror 321. The first branch 30 and the second branch 31 are coupled to the sensing branch 32 by means of a splitter 34.

In this first embodiment, the first emitter 20 emits a first signal which reaches the sensing branch 32 through the first branch 30, runs through the sensing branch 32, and is modified depending on the current circulating through the conductor 4, and is received by the second receiver 23 from the second branch 31. Furthermore, the second emitter 21 emits a second signal which reaches the sensing branch 32 through the second branch 31, runs through the sensing branch 32, and is modified depending on the current circulating through the conductor 4, and is received by the first receiver 22 from the first branch 30. The current circulating through the conductor 4 is thereby determined by combining the first modified signal received by the second receiver 23 and the second modified signal received by the first receiver 22.

In this first embodiment, the interrogator 2 comprises a first rotator 24 connecting the first emitter 20 and the first receiver 22 of the interrogator 2 to the first branch 30 of the sensing portion 3. Furthermore, in this first embodiment the first rotator 24 and the first branch 30 of the sensing portion 3 are connected through a first intermediate fiber 60, as seen in FIG. 1. The first rotator 24 therefore couples the first signal emitted by the first emitter 20 to the first branch 30 of the sensing portion 3 through the first intermediate fiber 60. The first rotator 24 also couples the second signal modified in the sensing portion 3 to the first receiver 22 through the first intermediate fiber 60.

Similarly, in this first embodiment the interrogator 2 comprises a second rotator 25 connecting the second emitter 21 and the second receiver 23 of the interrogator 2 to the second branch 31 of the sensing portion 3. Furthermore, in this first embodiment the second rotator 25 and the second branch 31 of the sensing portion 3 are connected through a second intermediate fiber 61, as seen in FIG. 1. The second rotator 25 therefore couples the second signal emitted by the second emitter 21 to the second branch 31 of the sensing portion 3 through the second intermediate fiber 61. The second rotator 25 also couples the first signal modified in the sensing portion 3 to the second receiver 23 through the second intermediate fiber 61.

In this first embodiment, the first intermediate fiber 60 and the second intermediate fiber 61 are standard single-mode fibers. To join the interrogator 2 to the sensing portion 3 through standard single-mode intermediate fibers 60, the concept described in patent document WO2016198575A1, belonging to the same applicant and incorporated herein by reference, is used. Therefore, in this first embodiment both the first signal emitted by the first emitter 20 and the second signal emitted by the second emitter 21 is a signal formed by a set of at least two polarized light pulses, said pulses being polarized with a specific degree difference, said difference in polarization preferably being 90 degrees. In other words, in this first embodiment the first emitter 20 and the second emitter 21 of the interrogator 2 are configured for emitting signals comprising a set of at least two polarized light pulses, said pulses being polarized with a specific degree difference.

The first emitter 20 and the second emitter 21 of the interrogator 2 can be of any type described in patent document WO2016198575A1 or of any other type that is known to one skilled in the art and meets the requirements described above.

As described in patent document WO2016198575A1, the standard single-mode fibers 60 and 61 used for joining the interrogator 2 to the sensing portion 3 can cause a change in the characteristics of the light signal emitted from the emitter, for example, in its polarization. Said intermediate fibers can modify the polarization of light due to different aspects such as the temperature of said fibers, the vibrations they suffer, etc. The emission of signals formed by sets of at least two polarized light pulses, where said pulses are polarized with a specific degree difference, allows the measuring equipment to compensate for the alterations caused by the intermediate fibers. The polarized light pulses of the set of pulses can be simultaneous or can be emitted with a small time interval between said pulses, since this thereby assures that the behavior of the intermediate fiber is the same for all the pulses of the set of pulses.

Therefore, as explained in patent document WO2016198575A1, since the characteristics of the intermediate fiber do not affect current measurement, an intermediate fiber having the required length can be used. Therefore, it is possible to arrange the sensing portion 3 and the interrogator 2 at a distance of several kilometers without the measurement being affected by said intermediate fibers 60 and 61. The current of the conductors located in remote locations can therefore be measured without having to place the interrogator 2 in said locations, in which the requirements necessary for the operation of said interrogators may not be complied with, for example, the unavailability of reliable power supply.

In this first embodiment, the first branch 30 of the sensing portion 3 comprises a first polarizer 300, said first polarizer 300 being a linear polarizer filtering the input signal, allowing only a specific direction of oscillation of the electric field of the light to go through. The first polarizer 300 preferably only allows the part of the signal oscillating at 0 degrees to go through.

In this first embodiment, the first branch 30 of the sensing portion 3 also comprises a rotator 301. Said rotator 301 is a geometric rotator which is obtained by means of twisting the fiber 302 connecting the first polarizer 300 to the splitter 34.

Ideally, the rotation provided by the rotator 301 is a 45-degree rotation because, with a 45-degree rotation, the quadratic terms of the first modified signal and the second modified signal disappear, simplifying the process of recovering each of said signals in the receiver, maximizing the sensitivity of the measuring equipment 1, in addition to providing phase information.

However, it is not easy to obtain a rotator 301 which provides an exact 45-degree rotation and furthermore remains stable throughout its entire service life. Therefore, in practice, the quadratic terms of the first modified signal and the second modified signal do not disappear, but, by combining the first modified signal and the second modified signal, said quadratic terms are indeed eliminated, obtaining a resulting signal that maintains the form of the signal and therefore allows obtaining the desired information. Combining the first modified signal and the second modified signal therefore makes it easier to manufacture the measuring equipment 1 as it allows suitable current measurement, although the calibration of the rotator 301 is not 45 degrees.

In this first embodiment, the second branch 31 of the sensing portion 3 comprises a second polarizer 310, said second polarizer 310 being a linear polarizer filtering the input signal, allowing only a specific direction of oscillation of the electric field of the light to go through. The second polarizer 310 preferably only allows the part of the signal oscillating at 0 degrees to go through.

In this first embodiment, the fiber 312 connecting the second polarizer 310 to the splitter 34 does not provide any rotation to the signal going through same. In other possible embodiments not shown in the drawings, said fiber could also provide rotation to the signal going through same. As mentioned above, ideally the rotation provided to the signals reaching the first and the second receiver 22 and 23 is a 45-degree rotation. As described above, to determine the current circulating through the conductor 4, the first signal emitted by the first emitter 20 circulates through the first branch 30 of the sensing portion 3 in the outward path, and once modified in the sensing branch 32, it circulates in the return path through the second branch 31 of the sensing portion 3 until reaching the second receiver 23 of the interrogator 2. Similarly, the second signal emitted by the second emitter 21 circulates through the second branch 31 of the sensing portion 3 in the outward path, and once modified in the sensing branch 32, it circulates in the return path through the first branch 31 of the sensing portion 3 until reaching the first receiver 22.

Therefore, ideally it is of interest for the sum of the rotation provided to the signal in the outward path and in the return path to be about 45 degrees, regardless of how said objective is achieved. For example, in an embodiment not shown in the drawings, the fiber joining the first polarizer to the splitter may rotate the signal about 22.5 degrees, whereas the fiber joining the second polarizer to the splitter may rotate the signal another 22.5 degrees. Therefore, as explained above, the first signal emitted by the first emitter would be rotated 22.5 degrees as it goes through the first branch of the sensing portion, and after going through the sensing branch, said first modified signal would again be rotated another 22.5 degrees as it goes through the second branch before being received in the second emitter. As a result of the rotation provided by both fibers, a total rotation of 45 degrees will thus be achieved. Similarly, the second signal emitted by the second emitter would be rotated 45 degrees as a result of said fibers.

As mentioned above, in this first embodiment the sensing portion 3 comprises a sensing section 320 in which the polarization of the signals emitted from the interrogator 2 varies depending on the magnetic field generated by the current circulating through the conductor 4. Specifically, in this first embodiment the sensing section 320 comprises an optical fiber winding suitable for being arranged around the conductor 4, the optical fiber of the winding corresponding with the optical fiber through which the signals emitted by the interrogator 2 circulate. In other possible embodiments not shown in the drawings, the sensing section may be made in other ways known to one skilled in the art.

Furthermore, in this first embodiment the sensing portion 3 also comprises a reflective mirror 332 after the sensing section 320. In this first embodiment, said mirror 332 can be a conventional mirror or a Faraday mirror.

As mentioned above, the first branch 30 and the second branch 31 of the sensing portion 3 are coupled to the sensing branch 32 by means of a splitter 34. As seen in FIG. 1, the splitter 34 of this first embodiment is a splitter 34 comprising two inputs 340 and 341 and two outputs 342 and 343. In this first embodiment, the first branch 30 of the sensing portion 3 is connected to the first input 340 of the splitter 34, the second branch 31 is connected to the second input 341 of the splitter 34, and the sensing branch 32 is connected to the first output 342 of the splitter 34, the second output 343 of the splitter 34 not being connected in this embodiment. When the first signal emitted by the first emitter 20 reaches the first input 340 of the splitter 34, the splitter 34 splits the power of said first signal in two, the first signal exiting through each of the outputs 342 and 343 of the splitter 34, but with half the power. Similarly, when the second signal emitted by the second emitter 21 reaches the second input 341 of the splitter 34, the splitter 34 splits the power of said second signal in two, the second signal exiting through each of the outputs 342 and 343 of the splitter 34, but with half the power. When the signal circulates in the opposite direction, i.e., when the first signal modified in the sensing branch 32 reaches the first output 342 of the splitter 34, the operation of said splitter 34 is the same, splitting the power of said first modified signal in two, the first modified signal exiting through each of the inputs 340 and 341 of the splitter 34, but with half the power. Similarly, when the second signal modified in the sensing branch 32 reaches the first output 342 of the splitter 34, the splitter 34 splits the power of said second modified signal in two, the second modified signal exiting through each of the inputs 340 and 341 of the splitter 34, but with half the power.

As described above, the first emitter 20 emits a first signal which reaches the sensing branch 32 through the first branch 30, runs through the sensing branch 32, and is modified depending on the current circulating through the conductor 4, and is received by the second receiver 23 from the second branch 31. In this first embodiment, the first signal modified in the sensing branch 32 reaches the first output 342 of the splitter 34 which splits the power of said first modified signal in two, the first modified signal exiting through each of the inputs 340 and 341 of the splitter 34, and therefore the first modified signal will reach not only the second receiver 23 but also the first receiver 22. However, for the application of the method of the invention, the first modified signal which reaches the first receiver 22 will be dismissed, only taking into account the first modified signal which reaches the second receiver 23.

Furthermore, the second emitter 21 emits a second signal which reaches the sensing branch 32 through the second branch 31, runs through the sensing branch 32, and is modified depending on the current circulating through the conductor 4, and is received by the first receiver 22 from the first branch 30. In this first embodiment, the second signal modified in the sensing branch 32 reaches the first output 342 of the splitter 34 which splits the power of said second modified signal in two, the second modified signal exiting through each of the inputs 340 and 341 of the splitter 34, and therefore the second modified signal will reach not only the first receiver 22 but also the second receiver 23. However, for the application of the method of the invention, the second modified signal which reaches the second receiver 23 will be dismissed, only taking into account the second modified signal which reaches the first receiver 22.

The current circulating through the conductor 4 is thereby determined by combining the first modified signal received by the second receiver 23 and the second modified signal received by the first receiver 22.

In this first embodiment, the first receiver 22 and the second receiver 23 comprise a respective photodiode. As mentioned above, the first receiver 22 will receive the second signal modified in the sensing portion 3, whereas the second receiver 23 will receive the first signal modified in the sensing portion 3. The photodiodes convert light into intensity, such that the control unit 26 can determine the current circulating through the conductor 4 by processing and combining the intensity it receives from the photodiode of the first receiver 22 and the intensity it receives from the photodiode of the second receiver 23.

As a final result of the combination of the first signal travelling from the first emitter 20 through the first branch 30 to the sensing branch 32 and returning from the sensing branch 32 through the second branch 31 to the second receiver 23, and the second signal travelling from the second emitter 21 through the second branch 31 to the sensing branch 32 and returning from the sensing branch 32 through the first branch 30 to the first receiver 22, the following equation would be obtained:

$$I_{receiver\ 1} - I_{receiver\ 2} = \gamma \sin 4\gamma\varphi \sin 2(\theta_2 - \theta_1)$$

where:

$I_{receiver\ 1}$=the light intensity calculated by the first receiver 22.

$I_{receiver\ 2}$=the light intensity calculated by the second receiver 23.

$$\gamma = \frac{\left(\frac{\delta_c}{2} + \psi\right)}{\sqrt{\left(\frac{\delta_l}{2}\right)^2 + \left(\frac{\delta_c}{2} + \psi\right)^2}}$$

where:

$\delta_c$=the circular birefringence of the fiber of the winding of sensing section 320
$\psi$=spin of the fiber of the winding of sensing section 320
$\delta_l$=the linear birefringence of the fiber of the winding of sensing section 320
given that $$\delta_l < \left(\frac{\delta_c}{2} + \psi\right)$$

is always true, this means that $\gamma$ is about 1 in all cases.

$$\varphi = V * B * l$$

where:
V=the Verdet constant of the optical fiber at the working wavelength
B=the magnetic field generated by conductor 4
l=the length of the winding of sensing section 320
$\theta_2$=the rotation provided by fiber 312 connecting the second polarizer 310 and the splitter 34.
$\theta_1$=the rotation provided by fiber 302 connecting the first polarizer 300 and the splitter 34.

Therefore, the value B relating to the magnetic field generated around the conductor 4 will be obtained, and therefore the intensity circulating through said conductor 4 can be determined. As can be seen, there are no quadratic terms in the obtained equation. This occurs as a result of the double symmetrical measurement that is performed, i.e., the emission of the first signal through the first branch 30 and the reception of said first modified signal through the second branch 31, and the emission of the second signal through the second branch 31 and the reception of said second modified signal through the first branch 30, given that with this double symmetrical measurement the quadratic terms of the signal are eliminated, even in conditions where the rotation provided to the signal by means of the fiber 312 connecting the second polarizer 310 and the splitter 34 and/or the fiber 302 connecting the first polarizer 300 and the splitter 34 is not 45 degrees, making it easier to manufacture the sensor.

Figure 2:
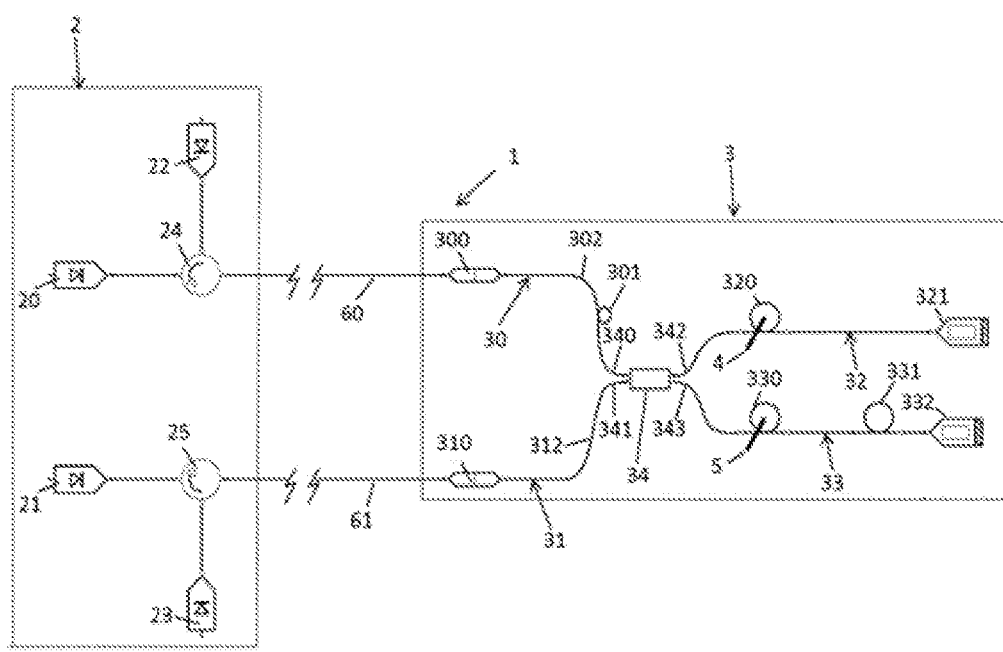
FIG. 2 schematically shows optical fiber-based current measuring equipment according to a second embodiment.

FIG. 2 shows a second embodiment that differs from the first embodiment in that the sensing portion 3 comprises an additional sensing branch 33. Therefore, with the configuration of the second embodiment, the current circulating through two different conductors 4 and 5 can be determined.

The measuring equipment 1 of the second embodiment comprises an interrogator 2 with a first emitter 20 and a second emitter 21. The interrogator 2 also comprises a first receiver 22 and a second receiver 23.

The measuring equipment of the second embodiment also comprises a sensing portion 3 connected to the interrogator 2. The sensing portion 3 comprises a first branch 30 comprising a first polarizer 300 and a rotator 301 after said first polarizer 300, and a second branch 31 comprising a second polarizer 310. Furthermore, the sensing portion 3 comprises a sensing branch 32 comprising a sensing section 320 arranged close to a conductor 4 and a mirror 321, and an additional sensing branch 33 comprising an additional sensing section 330 configured for being arranged close to an additional conductor 5, a delayer 331, and an additional mirror 332. The sensing branch 32 and the additional sensing branch 33 are coupled to the first branch 30 and to the second branch 31 by means of a splitter 34. Specifically, the additional sensing branch 33 is connected to the second output 343 of the splitter 34.

In this second embodiment, the additional mirror 332 of the additional sensing branch 33 is a Faraday mirror. The additional mirror 332 being a Faraday mirror allows introducing the delayer 331 between the additional sensing section 330 and the additional mirror 332 because, since the additional mirror 332 is a Faraday mirror, the fiber joining the additional sensing section 330 to the additional mirror 332 does not affect the measurement of the current circulating through the additional conductor 5. The delayer 331 must be introduced when the sensing portion 3 has more than one sensing branch, since said delayer allows managing the signals received in the receivers of the interrogator 2.

The rest of the configuration of the second embodiment is the same as the configuration of the first embodiment, so it is not considered necessary to describe it again.

As mentioned above, this second embodiment allows determining the current circulating both through the conductor 4 and through the additional conductor 5.

The method for determining the current circulating through the conductor 4 is the same as the one explained for the first embodiment.

The method for determining the current circulating through the additional conductor 5 is described below.

The first signal emitted by the first emitter 20 also reaches the additional sensing branch 33 through the first branch 30, and the second signal emitted by the second emitter 21 also reaches the additional sensing branch 33 through the second branch 31.

The first signal and the second signal run through the additional sensing branch 33 and are modified depending on the current circulating through the additional conductor 5.

The second receiver 23 receives from the second branch 31 the first signal modified in the additional sensing branch 33, the first receiver 22 also receiving from the first branch 30 the second signal modified in the additional sensing branch 33.

The current circulating through the additional conductor 5 is determined by combining both signals.

Like the sensing section 320, in this second embodiment the additional sensing section 330 is an additional optical fiber winding arranged around the additional conductor 5.

In another possible embodiment not shown in the drawings, the sensing portion may comprise more than one additional sensing branch, such that the current circulating through as many additional conductors as additional sensing branches the sensing portion has could be determined. In said embodiments, the splitter would need to have as many outputs as sensing branches and each additional sensing branch would need to have a delayer between the additional sensing section and the additional mirror, each of said delayers being different from the rest of the delayers of the additional sensing branches.

Figure 3:
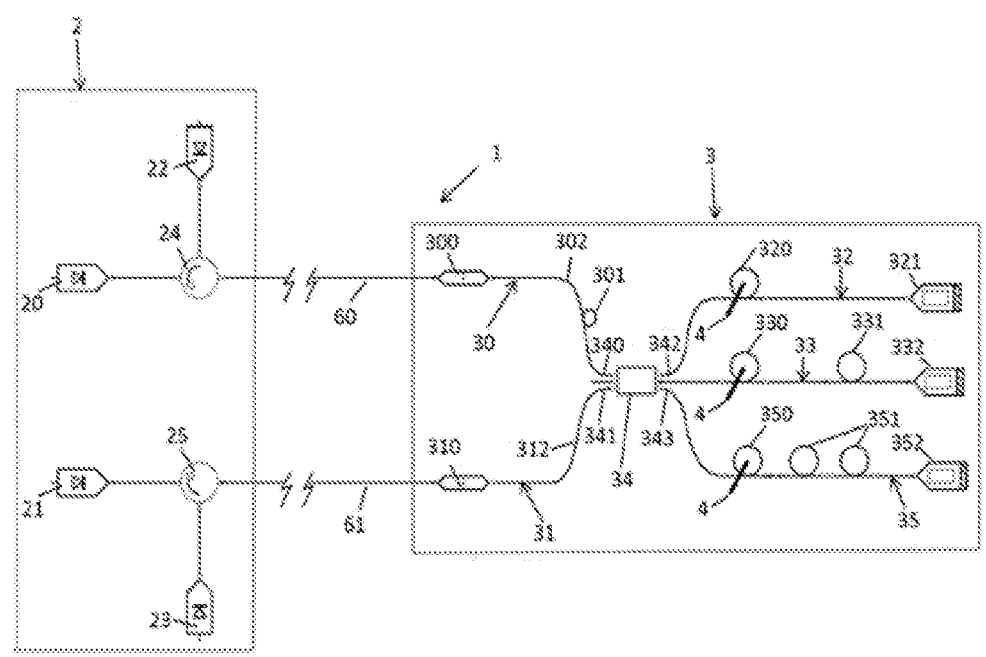
FIG. 3 schematically shows optical fiber-based current measuring equipment according to a third embodiment.

FIG. 3 shows a third embodiment that differs from the first embodiment in that the sensing portion 3 comprises a first additional sensing branch 33 and a second additional sensing branch 35.

The measuring equipment 1 of the third embodiment comprises an interrogator 2 with a first emitter 20 and a second emitter 21. The interrogator 2 also comprises a first receiver 22, and a second receiver 23.

The sensing portion 3 of the measuring equipment of the third embodiment is connected to the interrogator 2 and comprises a first branch 30 comprising a first polarizer 300 and a rotator 301 after said first polarizer 300, and a second branch 31 comprising a second polarizer 310.

Furthermore, the sensing portion 3 comprises a sensing branch 32, the first additional sensing branch 33, and the second additional sensing branch 35. The sensing branch 32 comprises a sensing section 320 arranged close to a conductor 4, and a mirror 321. The first additional sensing branch 33 comprises a first additional sensing section 330 configured for being arranged close to the conductor 4, a first delayer 331, and a first additional mirror 332. The second additional sensing branch 35 comprises a second additional sensing section 350 configured for being arranged close to the conductor 4, a second delayer 351, and a second additional mirror 352. The first delayer 331 of the first additional sensing branch 33 and the second delayer 351 of the second additional sensing branch 35 are different so that different signals can be managed in the receivers 22 and 23 of the interrogator 2.

The sensing branch 32, the first additional sensing branch 33, and the second additional sensing branch 35 are coupled to the first branch 30 and to the second branch 31 of the sensing portion 3 by means of a splitter 34. In this embodiment, the splitter comprises three inputs and three outputs, the first branch 30 and the second branch 31 being connected to two of the inputs of said splitter 34, and the sensing branch 32, the first additional sensing branch 33, and the second additional sensing branch 35 being connected to the outputs of the splitter 34.

In this second embodiment, the mirror 321 of the sensing branch 32, the first additional mirror 332 of the first additional sensing branch 33, and the second additional mirror 352 of the second additional sensing branch 33 are Faraday mirrors so as to enable introducing the respective delayers, as mentioned above.

The rest of the features of the third embodiment are the same as the features of the first embodiment, so it is not considered necessary to describe them again.

In this third embodiment, the sensing section 320, the first additional sensing section 330, and the second additional sensing section 350 are an optical fiber winding arranged around the conductor 4, the first winding, the second winding, and the third winding comprising a different number of turns. A plurality of sensing branches 32, 33 and 35 with different sensitivity (due to the number of turns of the winding of the respective sensing section 320, 330 and 350) are therefore used for determining the current of one and the same conductor 4. This configuration allows configuring sensing branches 32, 33 and 35 with different sensitivity for determining the current circulating through the conductor 4, such that depending on said current, despite one of the sensing branches 32, 33 and 35 having a lower sensitivity, the current circulating through the conductor 4 can be determined by means of the rest of the sensing branches 32, 33 and 35.

In addition to helping to determine intensity, arranging multiple windings on one and the same magnetic field generated by a conductor 4 contributes to measurement redundancy, since the breakage of the fiber of one of the windings or of a fiber joining the winding with the corresponding mirror would allow maintaining current measurement, furthermore indicating said breakage.

The method for determining the current circulating through the conductor 4 is similar to the one explained above.

The first signal emitted by the first emitter 20 reaches the sensing branch 32, the first additional sensing branch 33, and the second additional sensing branch 35 through the first branch 30. The second signal emitted by the second emitter 21 also reaches the sensing branch 32, the first additional sensing branch 33, and the second additional sensing branch 35 through the second branch 31.

The first signal and the second signal run through the sensing branch 32, the first additional sensing branch 33, and the second additional sensing branch 35, and are modified depending on the current circulating through the conductor 4.

The second receiver 23 receives from the second branch 31 the first signal modified in the sensing branch 32, in the first additional sensing branch 33, and in the second additional sensing branch 35. Similarly, the first receiver 22 receives from the first branch 30 the second signal modified in the sensing branch 32, in the first additional sensing branch 33, and in the second additional sensing branch 35.

The current circulating through the conductor 4 is determined by combining both signals.

In other possible embodiments not shown in the drawings, the number of additional sensing sections can be different from that of the third embodiment. Therefore, the sensing portion may comprise only one additional sensing branch or more than two additional sensing branches. The operation of the measuring equipment with these configurations would be similar to that explained for this third embodiment.

In other possible embodiments not shown in the drawings, the interrogator can be arranged next to the sensing portion without having to use intermediate fibers for joining both portions, or the intermediate fibers used being of a minimum length. In these cases, there is no risk of the intermediate fiber affecting the current measurement, and therefore the first signal and the second signal can be made up of a single polarized light pulse.

The following clauses represent additional embodiments.

Clause 1: A method for measuring the current circulating through at least one conductor (4) with optical fiber-based measuring equipment (1), the measuring equipment (1) comprising an interrogator (2) comprising a first emitter (20), a second emitter (21), a first receiver (22), and a second receiver (23), and a sensing portion (3) connected to the interrogator (2) and arranged close to the conductor (4), the sensing portion (3) comprising a first branch (30) comprising a first polarizer (300) and a rotator (301) after said first polarizer (300), a second branch (31) comprising a second polarizer (310), and at least one sensing branch (32) comprising a sensing section (320) arranged close to the conductor (4) and a mirror (321), the first branch (30) and the second branch (31) being coupled to the sensing branch (32) by means of a splitter (34), the first emitter (20) emits a first signal which reaches the sensing branch (32) through the first branch (30), runs through the sensing branch (32), and is modified depending on the current circulating through the conductor (4), and is received by the second receiver (23) from the second branch (31), and the second emitter (21) emits a second signal which reaches the sensing branch (32) through the second branch (31), runs through the sensing branch (32), and is modified depending on the current circulating through the conductor (4), and is received by the first receiver (22) from the first branch (30), the current circulating through the conductor (4) being determined by combining the first modified signal and the second modified signal.

Clause 2: The method according to clause 1, wherein the sensing portion (3) comprises at least one additional sensing branch (33), said at least one additional sensing branch (33) comprising an additional sensing section (330) arranged close to an additional conductor (5), a delayer (331), and an additional mirror (332), said at least one additional sensing branch (33) being coupled to the first branch (30) and to the second branch (31) by means of the splitter (34), wherein the first signal also reaches said at least one additional sensing branch (33) through the first branch (30), and the second signal also reaches said at least one additional sensing branch (33) through the second branch (31), the first signal and the second signal run through said at least one additional sensing branch (33) and are modified depending on the current circulating through said additional conductor (5), and the second receiver (23) receives from the second branch (31) the first signal modified in said at least one additional sensing branch (33), the first receiver (22) also receiving from the first branch (30) the second signal modified in said at least one additional sensing branch (33), the current circulating through the additional conductor (5) being determined by combining the first modified signal and the second modified signal.

Clause 3: The method according to clause 2, wherein the sensing section (320) is an optical fiber winding arranged around the conductor (4), and the additional sensing section (330) is an additional optical fiber winding arranged around the additional conductor (5).

Clause 4: The method according to clause 1, wherein the sensing portion (3) comprises at least one additional sensing branch comprising an additional sensing section (330) arranged close to the conductor (4), a delayer (331), and an additional mirror (332), said at least one additional sensing branch (33) being coupled to the first branch (30) and to the second branch (31) by means of the splitter (34), wherein the first signal also reaches said at least one additional sensing branch (33) through the first branch (30), and the second signal also reaches said at least one additional sensing branch (33) through the second branch (31), the first signal and the second signal run through said at least one additional sensing branch (33) and are modified depending on the current circulating through the conductor (4), and the second receiver (23) receives from the second branch (31) the first signal modified in said at least one additional sensing branch (33), the first receiver (22) also receiving from the first branch (30) the second signal modified in said at least one additional sensing branch (33), the current circulating through the conductor (4) also being determined by combining the first modified signal and the second modified signal.

Clause 5: Optical fiber-based current measuring equipment for measuring the current circulating through at least one conductor (4), comprising an interrogator (2) comprising a first emitter (20), a second emitter (21), a first receiver (22), and a second receiver (23), and a sensing portion (3) connected to the interrogator (2), the sensing portion (3) comprising a first branch (30) comprising a first polarizer (300) and a rotator (301) after said first polarizer (300), a second branch (31) comprising a second polarizer (310), and a sensing branch (32) comprising a sensing section (320) arranged close to a conductor (4) and a mirror (321), said sensing branch (32) being coupled to the first branch (30) and the second branch (31) by means of a splitter (34), at least one additional sensing branch (33) comprising an additional sensing section (330) configured for being arranged close to the conductor (4) or to an additional conductor (5), a delayer (331), and an additional mirror (332), said at least one additional sensing branch (33) being coupled to the first branch (30) and to the second branch (31) by means of the splitter (34).

Clause 6: The measuring equipment according to clause 5, wherein the additional sensing section (330) is arranged close to an additional conductor (5), the sensing sections (320, 330) being optical fiber windings that are arranged around the respective conductor (4, 5).

Clause 7: The measuring equipment according to clause 5, wherein the sensing section (320) and the additional sensing section (330) are arranged close to the same conductor (4), the sensing sections (320, 330) being optical fiber windings that are arranged around the conductor (4), and the first winding and the second winding comprising a different number of turns.

Clause 8: The measuring equipment according to any of clauses 5 to 7, wherein the rotation of the rotator (24) of the first branch (30) is about 45 degrees.

Clause 9: The measuring equipment according to any of clauses 5 to 7, wherein the second branch (31) comprises an additional rotator (311) after the second polarizer (310), the sum of the rotator (301) of the first branch (30) and the additional rotator (311) of the second branch (31) preferably being about 45 degrees.

Clause 10: The measuring equipment according to any of clauses 5 to 9, wherein the additional mirror of the additional sensing branch (33) is a Faraday mirror.

What is claimed is:

1. A method for measuring a first current circulating through a first conductor with optical fiber-based measuring equipment:

the fiber-based measuring equipment including:
an interrogator comprising:
a first light emitter,
a first light receiver,
a first coupler to which each of the first light emitter and first light receiver is optically coupled,
a second light emitter,
a second light receiver: and
a second coupler to which each of the second light emitter and second light receiver is optically coupled;
a sensing portion located in proximity to the first conductor, the sensing portion including:
a first branch having a first polarizer and a first rotator located downstream the first polarizer,
a second branch having a second polarizer,
a first sensing branch including a first sensing section arranged close to the first conductor and a first mirror located downstream the first sensing section,
a third coupler having first and second inputs and a first output, the first branch and the second branch being respectively optically coupled to the first and second inputs, and the first sensing branch being optically coupled to the first output;
a first single-mode optical fiber that optically couples the first branch to the first coupler;
a second single-mode optical fiber that optically couples the second branch to the second coupler;

the method comprising:
directing a first light pulse emitted by the first light emitter towards the first mirror sequentially through the first coupler, the first single-mode optical fiber, the first branch and the first sensing branch, the first light pulse being delivered through the first sensing section and being modified depending on the first current circulating through the first conductor to produce a first modified first light pulse;
directing a second light pulse emitted by the second light emitter towards the first mirror sequentially through the second coupler, the second single-mode optical fiber, the second branch and the first sensing branch, the second light pulse being delivered through the first sensing section and being modified depending on the first current circulating through the first conductor to produce a first modified second light pulse;
by use of the first mirror, reflecting the first modified first light pulse toward the second receiver sequentially through the first sensing branch, the second branch, the second single-mode optical fiber and the second coupler; and
by use of the first mirror, reflecting the first modified second light pulse toward the first receiver sequentially through the first sensing branch, the first branch, the first single-mode optical fiber and the first coupler.

2. The method according to claim 1, further comprising determining the first current circulating through the first conductor by combining the first modified first light pulse received in the second receiver with the first modified second light pulse received in the first receiver.

3. The method according to claim 1, wherein the first and second receivers respectively comprise first and second photodiodes that respectively convert the first modified second light pulse received in the first receiver and the first modified first light pulse received in the second receiver into respective first and second light intensities, the method of determining the current circulating through the first conductor comprising combining the first and second light intensities.

4. The method according to claim 1, wherein the first sensing section comprises a first optical fiber winding arranged around the first conductor.

5. The method according to claim 1, further comprising a method for measuring a second current circulating through a second conductor located close to a second sensing section of a second sensing branch of the sensing portion, the second sensing branch including a delayer and a second mirror located sequentially downstream the second sensing section, the second sensing branch being optically coupled to a second output of the third coupler; the method comprising:

directing the first light pulse towards the second mirror sequentially through the first coupler, the first single-mode optical fiber, the first branch and the second sensing branch, the first light pulse being delivered through the second sensing section and being modified depending on the second current circulating through the second conductor to produce a second modified first light pulse;
directing the second light pulse towards the second mirror sequentially through the second coupler, the second single-mode optical fiber, the second branch and the second sensing branch, the second light pulse being delivered through the second sensing section and being modified depending on the second current circulating through the second conductor to produce a second modified second light pulse;
by use of the second mirror, reflecting the second modified first light pulse towards the second receiver sequentially through the second sensing branch, the second branch, the second single-mode optical fiber and the second coupler; and
by use of the second mirror, reflecting the second modified second light pulse towards the first receiver sequentially through the second sensing branch, the first branch, the first single-mode optical fiber and the first coupler.

6. The method according to claim 5, further comprising determining the second current circulating through the second conductor by combining the second modified first light pulse received in the second receiver with the second modified second light pulse received in the first receiver.

7. The method according to claim 5, wherein the first and second receivers respectively comprise first and second photodiodes that respectively convert the second modified first light pulse received in the second receiver and the second modified second light pulse received in the first receiver into first and second light intensities, the method of determining the current circulating through the second conductor comprising combining the first and second light intensities.

8. The method according to claim 5, wherein the second sensing section comprises a second optical fiber winding arranged around the second conductor.

9. The method according to claim 5, wherein as a result of the use of the delayer in the second sensing branch, the first modified first optical pulse is received in the second receiver prior to the second modified first optical pulse and the first modified second optical pulse is received in the first receiver prior to the second modified second optical pulse.

10. The method according to claim 1, wherein the sensor portion further includes a second sensing branch having a second sensing section located close to the first conductor, the second sensing branch including a delayer and a second mirror located sequentially downstream the second sensing section, the second sensing branch being optically coupled to a second output of the splitter; the method further comprising:
   directing the first light pulse towards the second mirror sequentially through the first coupler, the first single-mode optical fiber, the first branch and the second sensing branch, the first light pulse being delivered through the second sensing section and being modified depending on the first current circulating through the first conductor to produce a second modified first light pulse;
   directing the second light pulse towards the second mirror sequentially through the second coupler, the second single-mode optical fiber, the second branch and the second sensing branch, the second light pulse being delivered through the second sensing section and being modified depending on the first current circulating through the first conductor to produce a second modified second light pulse;
   by use of the second mirror, reflecting the second modified first light pulse into the second receiver sequentially through the second sensing branch, the second branch, the second single-mode optical fiber and the second coupler;
   by use of the second mirror, reflecting the second modified second light pulse into the first receiver sequentially through the second sensing branch, the first branch, the first single-mode optical fiber and the first coupler; and
   determining the current circulating through the first conductor by combining the first modified first light pulse received in the second receiver with the first modified second light pulse received in the first receiver, and by combining the second modified first light pulse received in the second receiver with the second modified second light pulse received in the first receiver.

11. The method according to claim 10, wherein the first sensing section comprises a first optical fiber winding arranged around the first conductor and the second sensing section comprises a second optical fiber winding arranged around the first conductor, the first and second optical fiber windings comprising a different number of turns.

12. The method according to claim 1, wherein the first rotator rotates the first light pulse by about 45 degrees.

13. The method according to claim 1, further comprising a second rotator located in the second branch downstream the second polarizer, the first rotator rotates the first light pulse a first rotation and the second rotator rotates the second light pulse a second rotation, the sum of the first and second rotations being about 45 degrees.

14. The method according to claim 1, wherein the first mirror is a Faraday mirror.

15. Optical fiber-based measuring equipment configured for measuring a first current circulating through a first conductor, the equipment comprising:
   an interrogator including:
      a first light emitter configured to emit a first light pulse;
      a first light receiver;
      a first coupler to which each of the first light emitter and first light receiver is optically coupled,
      a second light emitter configured to emit a second light pulse,
      a second light receiver: and
      a second coupler to which each of the second light emitter and second light receiver is optically coupled;
   a sensing portion located in proximity to the first conductor, the sensing portion comprising:
      a first branch having a first polarizer and a first rotator located downstream the first polarizer,
      a second branch having a second polarizer,
      a first sensing branch including a first sensing section arranged close to the first conductor and a first mirror located downstream the first sensing section,
      a third coupler having first and second inputs and a first output, the first branch and the second branch being respectively optically coupled to the first and second inputs, and the first sensing branch being optically coupled to the first output;
   a first single-mode optical fiber that optically couples the first branch to the first coupler; and
   a second single-mode optical fiber that optically couples the second branch to the second coupler;
   the optical-based measuring equipment being arranged such that when the first light pulse is emitted by the first light emitter, the first light pulse is caused to be delivered towards the first mirror sequentially through the first coupler, the first single-mode optical fiber, the first branch and the first sensing branch, and to cause the first light pulse to be modified in the first sensing section depending on the current circulating through the first conductor to produce a first modified first light pulse;
   the optical-based measuring equipment being arranged such that when the second light pulse is emitted by the second light emitter, the second light pulse is caused to be delivered towards the first mirror sequentially through the second coupler, the second single-mode optical fiber, the second branch and the first sensing branch, and to cause the second light pulse to be modified in the first sensing section depending on the current circulating through the first conductor to produce a first modified second light pulse;
   the optical-based measuring equipment being arranged to cause the first mirror to reflect the first modified first light pulse toward the second receiver sequentially through the first sensing branch, the second branch, the second single-mode optical fiber and the second coupler;
   the optical-based measuring equipment being arranged to cause the first mirror to reflect the first modified second light pulse toward the first receiver sequentially through the first sensing branch, the first branch, the first single-mode optical fiber and the first coupler.

16. The optical-based measuring equipment according to claim 15, further comprising determining means configured to determine the first current circulating through the first conductor by combining the first modified first light pulse received in the second receiver with the first modified second light pulse received in the first receiver.

17. The optical-based measuring equipment according to claim 15, wherein the first receiver includes a first photodiode that is configured to convert the first modified second light pulse received in the first receiver into a first light intensity, and second receiver includes a second photodiode that is configured to convert the first modified first light pulse received in the first receiver into a second light intensity.

18. The optical-based measuring equipment according to claim 17, further comprising determining means configured to determine the first current circulating through the first conductor by combining the first and second light intensities.

19. The optical-based measuring equipment according to claim 15, wherein the sensing portion further comprises:
- a second sensing branch that includes a second sensing section arranged close to the first conductor;
- a second mirror located downstream the second sensing section;
- the third coupler having a second output, the second sensing branch being respectively optically coupled to the first and second branches through the second output.

20. The optical-based measuring equipment according to claim 19, wherein the first sensing section comprises a first optical fiber winding arranged around the first conductor and the second sensing section comprises a second optical fiber winding arranged around the first conductor, the first and second optical fiber windings comprising a different number of turns.

21. The optical-based measuring equipment according to claim 15, wherein the first rotator is configured to cause the first light pulse to rotate by about 45 degrees.

22. The optical-based measuring equipment according to claim 15, wherein the second branch includes a second rotator located downstream the second polarizer, the first rotator configured to rotate the first light pulse a first rotation and the second rotator configured to rotate the second light pulse a second rotation, the sum of the first and second rotations being about 45 degrees.

23. The optical-based measuring equipment according to claim 15, further being configured for measuring a second current circulating through a second conductor, wherein the sensing portion further comprises:
- a second sensing branch that includes a second sensing section arranged close to the second conductor;
- a second mirror located downstream the second sensing section;
- the third coupler having a second output, the second sensing branch being respectively optically coupled to the first and second branches through the second output.

* * * * *